United States Patent [19]

Guyot et al.

[11] 4,020,423
[45] Apr. 26, 1977

[54] METHOD AND CIRCUIT ARRANGEMENT FOR PRODUCING AND TRANSMITTING ELECTRICAL REFERENCE PULSES

[75] Inventors: Volker Guyot, Klein-Gerau; Paul Holdinghausen; Martin Mueller, both of Bickenbach, all of Germany

[73] Assignee: Carl Schenck AG, Darmstadt, Germany

[22] Filed: Apr. 28, 1975

[21] Appl. No.: 572,624

Related U.S. Application Data

[62] Division of Ser. No. 506,108, Sept. 16, 1974, Pat. No. 3,976,947, which is a division of Ser. No. 250,727, May 5, 1972, Pat. No. 3,852,673.

[30] Foreign Application Priority Data

May 10, 1971 Germany .......................... 2122967

[52] U.S. Cl. .............................. 328/151; 307/351; 307/362; 328/115
[51] Int. Cl.² ........................................ H03K 5/20
[58] Field of Search ........ 307/235 R, 235 A, 235 J, 307/235 E, 235 T, 264, 268; 328/115–117, 150–151

[56] References Cited

UNITED STATES PATENTS

| | | | |
|---|---|---|---|
| 3,267,296 | 8/1966 | Fuss ................................. | 307/235 J |
| 3,293,451 | 12/1966 | Henning et al. ............... | 307/235 A |
| 3,348,065 | 10/1967 | Schmidt ........................... | 307/235 J |
| 3,714,464 | 1/1973 | Nutt ............................... | 307/235 A |

Primary Examiner—John Zazworsky
Attorney, Agent, or Firm—W. G. Fasse; W. W. Roberts

[57] ABSTRACT

The present circuit arrangement is, for example, useful for producing reference signals in response to the rotation of a body such as a wheel or rotor to be balanced. Source signals are produced in response to the rotation of said body. Circuit means are provided for handling and comparing the source signals in such a manner that the reference signals are provided at an output terminal in response to the occurrence of the center of a source signal or in response to the maximum of a source signal. The transmittal may also be controlled in response to the center and the maximum of a source signal.

1 Claim, 6 Drawing Figures

METHOD AND CIRCUIT ARRANGEMENT FOR PRODUCING AND TRANSMITTING ELECTRICAL REFERENCE PULSES

This is a divisional of application Ser. No. 506,108 filed Sept. 16, 1974, now U.S. Pat. No. 3,976,947 which is a divisional application of Ser. No. 250,727, filed May 5, 1972, U.S. Pat. No. 3,852,673 granted on Dec. 3, 1974.

BACKGROUND OF THE INVENTION

The invention relates to a method and to circuit arrangements for producing electrical reference pulse signals and for transmitting such signals to an output terminal. The invention is especially useful for determining the angular position of an imbalance of a rotating body relative to the rotation of such bodies which are provided with a marker whereby the rotation of the marker is sensed without any reactive or feedback effect.

German Patent DBP 1,103,637 describes a method for producing reference pulses for determining the angular position of an imbalance whereby a marker is sensed by photoelectric or electromagnetic means for generating a spike or needle shaped pulse.

It is the purpose of this prior art to produce rectangular voltage wave forms which have an exact pulse shape and which are substantially free of harmonic waves.

Another German Patent DBP 1,103,639 also describes the production of reference pulses by sensing a relatively narrow marker on a rotating body whereby such reference pulses permit the measuring of the angular position of the imbalancing mass.

It is a drawback of the known method and devices for producing and transmitting electrical reference pulses that the accuracy of the produced pulses depends upon the accuracy with which the marker to be sensed is attached to rotating bodies of the same or of different types. Further, the known methods and devices are useful only for narrow markers to be sensed. In addition, there is no possibility in prior art methods and devices to ascertain and remove errors which, for example, may occur due to the aging of the photocells and which necessarily cause a change in the resolution of the pulses and thus in the accuracy of the reference signals to be transmitted.

OBJECTS OF THE INVENTION

In view of the foregoing, it is the aim of the invention to achieve the following objects singly or in combination:

to overcome the drawbacks of the prior art, especially to provide a method and circuit arrangement which will operate even in response to the sensing of relatively wide markers;

to generate reference pulses independently of the arrangement of a marker to be sensed, especially the accuracy of its positioning;

the reference signals are also to be produced independently of the photoelectric or electromagnetic means which are used for the scanning of the marker so that the sharpness or crispness of the marker will not influence the resulting reference signals;

to produce or control the production of the reference signals in response to the center of a source pulse or signal resulting from the scanning of said markers;

to produce or control the production of the reference signals in response to the occurrence of a maximum of the source signals resulting from the scanning of the markers;

to provide a method and circuit arrangement for controlling the production of reference pulses in response to the occurrence of the center and of the maximum of a source pulse, for example, a pulse generated by the rotation of a body to be balanced;

to produce the reference pulses free of interfering signals or pulses which will meet the requirements of balancing techniques, especially with regard to the reproducibility of measured results;

to provide a method and apparatus for sensing even very broad markers or markers which may be sensed only in a tangential manner relative to the rotating body carrying the marker; and to eliminate the proportion of interfering pulses or harmonic wave forms.

SUMMARY OF THE INVENTION

According to the invention there is provided a method for producing and transmitting electrical reference pulses in response to the rotation of any rotating body by sensing a marker attached to such body in a feedback free manner and controlling the transmittal of such reference pulses in response to the center of the pulses sensed from said rotating body. In a preferred embodiment of the present method, the transmittal of the electrical reference pulses is controlled in response to the maximum of the pulse amplitudes sensed from said rotating body. Said sensed pulses will here after be referred to as the source pulses. The invention further teaches to control the transmittal of the electrical reference pulses automatically in response to the maximum amplitude of the source pulses and in response to the center of the source pulses.

The control of the reference pulse transmittal in response to the maximum amplitude of the source pulses is especially suitable for avoiding the influence of interfering pulses or harmonic wave forms.

With regard to the control of the reference pulse transmittal in response to the center of the source pulses, the invention achieves the advantage that the transmittal is now independent of the revolution per minute of the rotating body as well as independent of the shape or the position of the marker to be scanned or sensed. Thus, according to the invention, an exact reference pulse will be transmitted regardless whether the marker itself is narrow or wide. It is considered to be a special advantage that now even wide markers may be employed or that the sensing may be accomplished only in a tangential manner relative to the rotating body.

Where the transmittal of the reference pulse is controlled by the center of the source pulse as well as by the maximum amplitude of the source pulse, the above outlined advantages are achieved in combination. Thus, interfering pulses or harmonic waves are substantially eliminated and the reference pulses are independent of the revolution per minute and of the shape of the marker. Furthermore, the quality of the electrical or electromagnetic sensing means also does not influence the exact reproducibility of the transmitted reference value.

A preferred circuit arrangement according to the invention for controlling the transmittal of a reference pulse in response to the center of source pulses comprises an integrator circuit to which the source pulses are applied through a rectifier, the integrator is connected to a storage capacitor to which the voltage appearing at the output of the integrator is applied under the control of a timing circuit. Thereafter, the integrator is reset whereby the voltage at its output is erased. Thereafter, a portion of the voltage stored in such storage capacitor is compared in a comparator with a voltage appearing at the output of the integrator as the result of the next source pulse.

A circuit arrangement for controlling the reference pulse automatically in response to the maximum amplitude value of the source pulse comprises, according to the invention, a comparator arrangement having two inputs. An input circuit connected to one input of the comparator device comprises a capacitor and a diode whereby a source pulse peak value stored in the capacitor is supplied to said one comparator input in series or in sequence with the entire source pulse. An adjustable potentiometer is connected to the other input of the comparator whereby a fixed adjusted voltage value is supplied to said other input. The comparator device has a given switching or circuit characteristic and the reference pulse appears at the output of the comparator device as a function of said characteristic. The just described embodiment has the advantage that the output reference pulse is free of interfering influences such as harmonic waves of the source pulses. Another advantage of this particular circuit arrangement is seen in that interfering voltages are eliminated independently of the amplitude of the source pulse.

In a modified embodiment of the above described circuit arrangement according to the invention a portion of the peak value of the source pulse is supplied to one input of a comparator device by means of a potentiometer adjusted to a fixed position. The source pulse is further supplied directly or without any influence to the same input of the comparator device. The reference pulse then appears at the output of the comparator device as a function of the circuit characteristic of said comparator device and free of interfering influences. This circuit arrangement also has the advantage that the interfering voltages are eliminated or filtered out independently of the impulse amplitude of the source pulse.

According to the invention it has been achieved for the first time in connection with balancing techniques to produce and transmit definite reference pulses free of interfering pulses and without regard to the width and the arrangement of the marker to be sensed. This has been achieved, remarkably without regard of the position of the sensing device relative to the marker and independently of the aging or quality of the photoelectric or electromagnetic sensing means.

BRIEF DESCRIPTION OF THE DRAWINGS

In order that the invention may be clearly understood, it will now be described, by way of example, with reference to the accompanying drawings; wherein.

DESCRIPTION OF
EXAMPLE EMBODIMENTS

Figure 1:
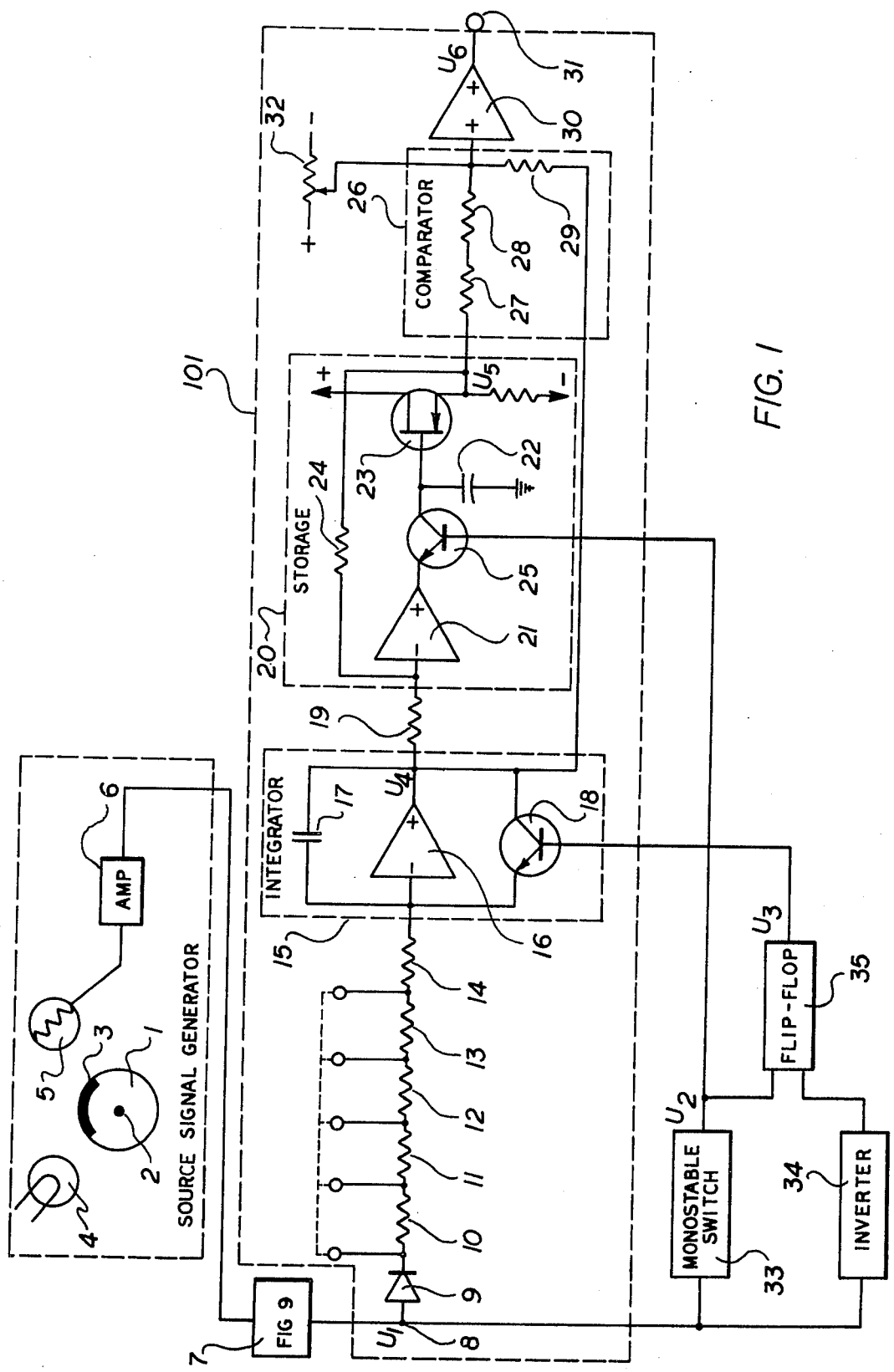
FIG. 1 is a preferred embodiment of a circuit arrangement for performing the method according to the invention, wherein the transmittal of an electrical reference pulse is controlled by the center of the source pulse.

Referring to FIG. 1 a rotor 1 is rotatably supported on a shaft 2. A marker 3 to be sensed or scanned is attached to the rotor 1. The marker 3 may, for example, comprise a reflecting strip or it may be a marker having certain magnetic characteristics. For example, in the shown embodiment, the marker 3 is scanned by means of a lamp 4 and a photocell 5 which receives the light rays reflected by the marker 3. However, the method according to the invention is not limited to using photoelectric sensing or scanning means. The present invention may be practiced by using any suitable scanning means.

Figure 2:
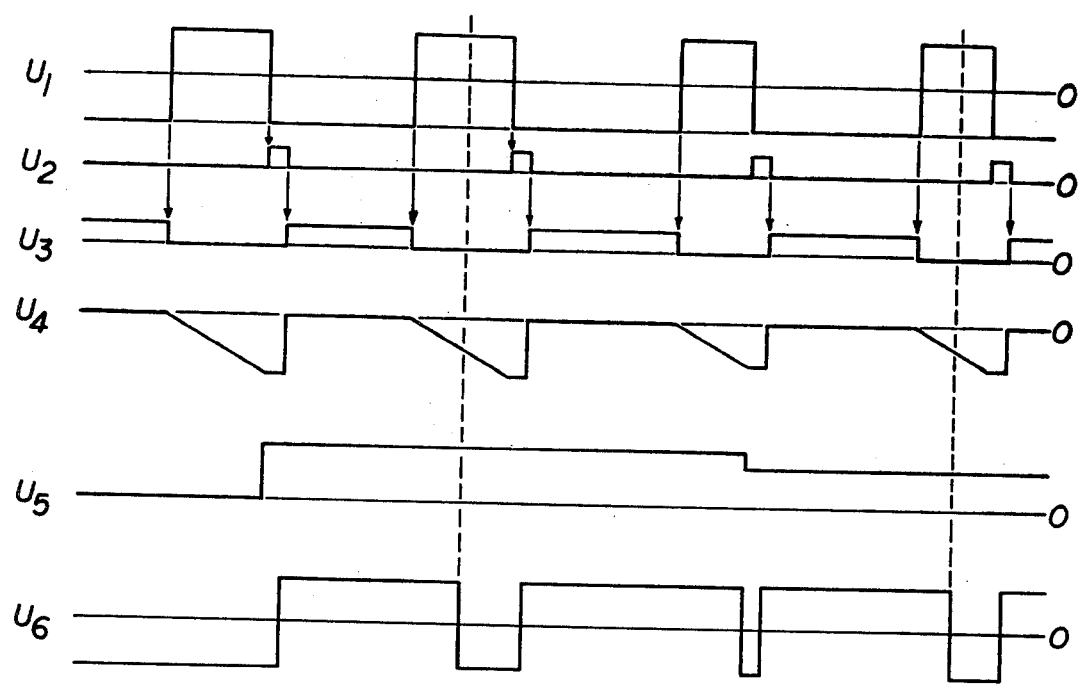
FIG. 2 illustrates the most important voltage wave forms of the circuit arrangement according to FIG. 1.

The scanning device 4, 5 is connected with its output to an input stage 6 which amplifies the scanned signals received from the scanning device and matches or attenuates such signal to the following circuit or circuit means 7. The pulses produced by the scanning device will be referred to as source pulses. The circuit arrangement 7 to be described in more detail below with reference to FIGS. 7 to 10 eliminates from the source pulse received from the scanning device and the input stage 6 interfering voltages or harmonic waves by producing a reference pulse which is automatically controlled in response to the maximum amplitude of the source pulse. As a result, an exact rectangular voltage wave form appears at the output 8 of the circuit arrangement 7. This rectangular voltage $U_1$ is shown in FIG. 2 and is supplied to a further circuit arrangement 101. The rectangular voltage $U_1$ is supplied to the input of an integrator circuit 15 through a rectifier 9 and a chain of resistors comprising a series of resistors 10 to 14 any one of which may be bridged to provide an adjustable impedance. The integrator 15 comprises a computing amplifier 16 which is provided with a negative feedback by means of a capacitor 17. The capacitor 17 may be short circuited by means of a switching transistor 18 for controlling the integrator 15. The output of the integrator 15 is connected to a storage device 20 by means of a resistor 19 for supplying the output voltage of the integrator to the storage. The storage 20 comprises a computing amplifier 21, a storage capacitor 22 and a field effect transistor 23 as well as a resistor 24 and a switching transistor 25. The storage 20 is connected with its output to a comparator stage 26 comprising the resistors 27, 28 and 29. A portion of the voltage stored in the storage device 20 is compared in the comparator 26 with the output voltage of the integrator 15 resulting from the next source pulse applied to the integrator 15. When the two voltages are equal, an output pulse is supplied to the output terminal through the amplifier 30. A zero deflection or original distortion of the amplifier 30 may be corrected by means of the potentiometer 32.

The circuit arrangement 101 is controlled by a timing device comprising a monostable switching means 33 which is connected with the output 8 of the circuit arrangement 7 thus receiving the output voltage $U_1$. The timing means further comprise an inverter 34 also connected to the output 8 of the circuit arrangement 7. The monostable device 33 and the inverter 34 are connected to the two inputs of a flip-flop circuit 35. The flip-flop circuit 35 is connected to the control terminal, for example, to the base of the switching transistor 18 in the integrator 15. The output $U_2$ of the monostable flip-flop 33 is further connected to the switching transistor 25 of the storage device 20.

The circuit arrangement 101 for controlling the transmittal of reference pulses in response to the center of the respective source pulse operates as follows. The precise rectangular voltage $U_1$ is applied to the monostable circuit 33, please see FIG. 2. At the end of each pulse of the voltage $U_1$ the monostable circuit 33 produces a pulse at its output which is shown as $U_2$ in FIG. 2. The output of the flip-flop circuit 35 produces a pulse sequence which begins when the pulse produced by the monostable circuit 33 ends. The pulse sequence in turn ends when the next pulse produced by the circuit arrangement 7 begins. This pulse sequence is shown as $U_3$ in FIG. 2. The rectangular voltage produced by the circuit 7 is further supplied in the circuit arrangement 101 to the integrator 15 through the rectifier 9 and the series of resistors 9 to 14. At the beginning of each pulse, the switching transistor 18 is blocked so that the capacitor 17 of the integrator 15 is charged linearly with respect to time by a negative voltage. The rectifier 9 prevents a further current flow with the trailing edge of the pulse.

Simultaneously with the foregoing, the switching transistor 25 of the storage 20 is made conductive by the pulse appearing at the output of the monostable circuit 33 whereby the voltage at the output of the integrator 15 is transmitted into the storage 20. By means of the computing amplifier 24 the stored voltage is reversed with regard to its polarity and it is assured that its magnitude corresponds exactly to the output voltage of the integrator 15. Upon completion of the pulse produced by the monostable circuit 33, the flip-flop circuit 35 switches the switching transistor 18 of the integrator 15 into its conducting state whereby the capacitor 17 of the integrator 15 is discharged through the switching transistor 18. As a result, the content of the integrator is quenched or erased whereby an output voltage appears at the output of the integrator 15 which is shown as $U_4$ in FIG. 4. Simultaneously, the switching transistor 25 is blocked or made non-conductive by the monostable circuit 33 so that the value which has been stored in the capacitor 22 remains in the capacitor. The wave form of the stored voltage is shown at $U_5$ in FIG. 2.

Simultaneously the output voltage of the integrator 15 is applied to the resistor 25 of the comparator stage 26 whereby it is compared with the stored voltage appearing across the resistors 27 and 28. Preferably, the resistors 27, 28 and 29 are each of equal value. If the integrator voltage resulting from the next following source pulse reaches half of the value of the voltage across the resistors 27 and 28, an output pulse is applied to the output terminal 1 of the circuit arrangement 101 through the amplifier 30. The amplifier 30 operates without negative feedback as a switching amplifier and it flips to produce a negative output voltage if the voltage in the comparator stage 26 becomes zero. Since the voltage produced by the circuit arrangement 7 has an exact rectangular wave form, the output voltage $U_4$ of the integrator 15 rises strictly proportional to time in a linear fashion as seen at $U_4$ in FIG. 2. Accordingly, a negative going pulse is produced at the output terminal 31 exactly at the point of time when the center of the rectangular pulse produced by the circuit arrangement 7 is reached.

Subsequent to changing the pulse width of the voltage $U_1$ as shown in the right hand portion of FIG. 2, the reference pulse is again produced at the right point of time already with the second pulse of narrower width. In other words, the production of reference pulses at the correct point of time is restored immediately with the first pulse following the change of pulse width.

At the time when the content of the integrator 15 is erased through the flip-flop circuit 35 and the switching transistor 18 only the voltage of the storage 20 is present at the input of the switching amplifier 30. Therefore, the input voltage of the amplifier 30 is positive and the output pulse is terminated.

In order to facilitate the dimensioning of the circuit elements it is suitable to select the storage voltage in a range between $+1$ and $+10$ volts. This may be achieved by bridging a portion of the resistor chain 10 to 14 by short circuiting the respective terminals shown in FIG. 1 whereby the impedance value is respectively adjusted.

The circuit arrangement or circuit means 7 will now be described in more detail with reference to FIGS. 3 to 6. The source pulses produced by the scanning or sensing device 4, 5 will have superimposed thereon interfering voltages or harmonic waves so that the wave form will have a shape approximately corresponding to that shown at $U_{10}$ and $U_{14}$ in FIG. 4 and 6 respectively. In these wave forms only the highest peaks result from the sensing or scanning of the marker on the rotating body. However, the height or value of these peaks may vary between substantial limits. It is the purpose of the circuit arrangement 7 to produce an exact rectangular wave form from the pulses produced by the scanning and shown at $U_{10}$ or $U_{14}$. The circuit arrangement 7 accomplishes this by producing the reference pulse or rather its output pulse automatically in response to the maximum height or amplitude of the source pulses.

Figure 3:
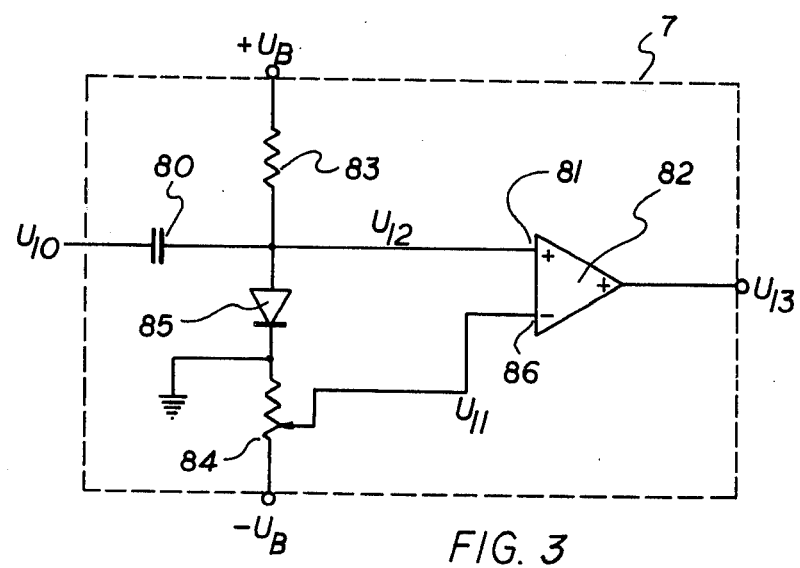
FIG. 3 shows a circuit arrangement for automatically controlling the transmittal of the electrical reference pulse in response to the maximum value of the source pulse height or amplitude.

FIG. 3 illustrates a first embodiment of the circuit arrangement 7 wherein the voltage $U_{10}$ produced by the scanning means 4, 5 is applied through a capacitor 80 to the input 81 of a switching amplifier 82. The capacitor 80 is also connected through the diode 85 to ground or zero potential. Thus, the capacitor 80 is charged to the peak value of the voltage $U_{10}$. Accordingly, the input 81 of the switching amplifier 82 is supplied with a voltage $U_2$ which is negative.

Figure 4:
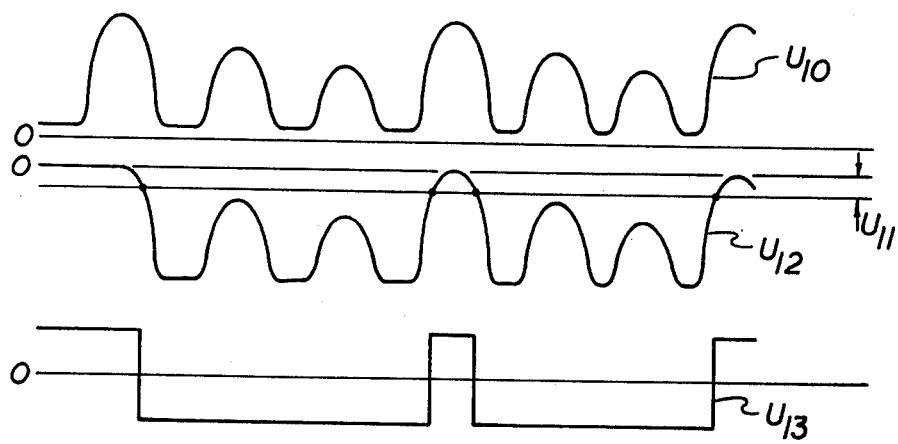
FIG. 4 illustrates the more important voltage characteristics or wave forms of the circuit arrangement according to FIG. 3.

To the second input 86 of the switching amplifier 82 there is applied a negative voltage $U_{11}$ which is tapped off from the potentiometer 84 connected to a negative voltage supply source. The voltages $U_{11}$ and $U_{12}$ applied to the inputs 86 and 81 respectively are shown in FIG. 4. The switching amplifier 82 changes its output signal if the difference between the two input voltages changes its polarity. At the output of the switching or computing amplifier 82 thus a signal is produced having the wave form $U_{13}$ illustrated in FIG. 4. The wave form $U_{13}$ has an exact rectangular shape and is suitable for the further use in the circuit arrangement 101 or in the other circuit arrangements described above. The resistor 83 makes it possible to slowly discharge the capacitor 80 so that its voltage may follow or correspond to a peak value of the source pulse which becomes gradually smaller.

Figure 5:
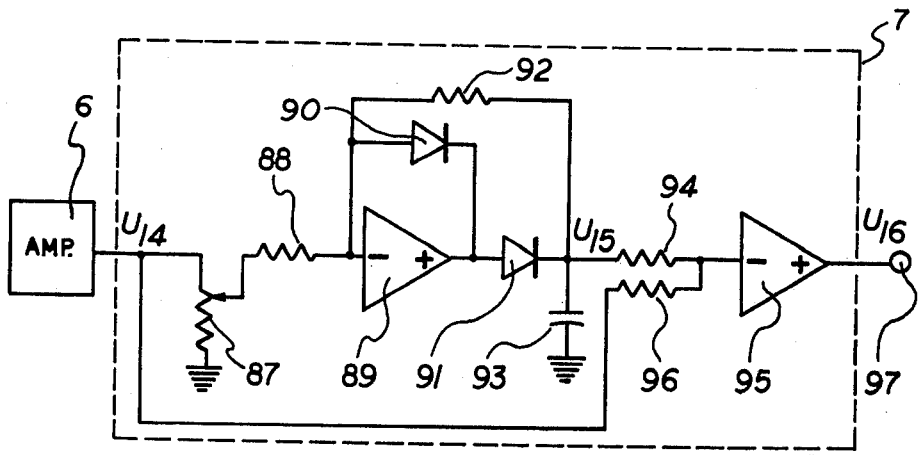
FIG. 5 shows a further circuit arrangement according to the invention for automatically controlling the transmittal of the electrical reference pulses in response to the maximum amplitude value or height.
Figure 6:
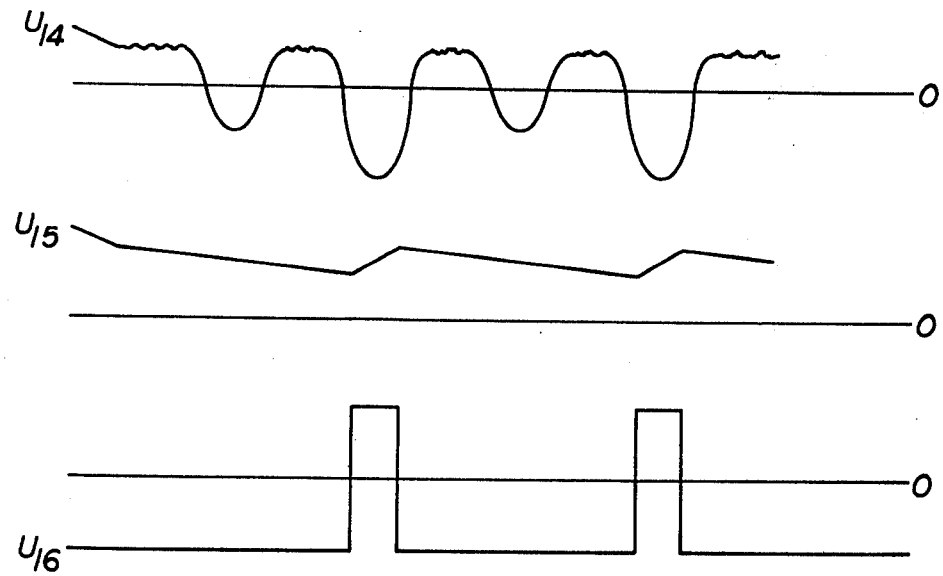
FIG. 6 illustrates the more important voltage wave forms in the circuit arrangement of FIG. 5.

Another embodiment of a circuit arrangement 7 is illustrated in FIG. 5 and its function will be explained with reference to FIG. 6. The source pulses $U_{14}$ produced by the sensing means 4, 5 and the input stage 6 is supplied through a potentiometer 87 and a resistor 88 to a computing amplifier 89 which is arranged as a peak value amplifier comprising the two diodes 90 and 91 as well as the resistor 92. The polarity reversed, negative peak voltage is stored in the capacitor 93. The wave form of the voltage stored in the capacitor 93 is shown in FIG. 6 at $U_{15}$. The voltage $U_{15}$ is supplied through a resistor 94 to the input of a switching amplifier 95. The same input of the switching amplifier 95 also receives the input voltage $U_{14}$ through a resistor 96 of equal value as the resistor 94. The output voltage of the switching amplifier 95 changes its polarity if the sum of the two voltages $U_{14}$ and $U_{15}$ changes its polarity. Thus, output reference voltage $U_{16}$ is produced in the respective wave form shown in FIG. 6 and corresponding to the source signal $U_1$ just as the reference signal $U_{13}$. With the aid of the potentiometer 87 it is possible to determine at which proportion of the peak value of the input voltage $U_{14}$ an output reference signal $U_{16}$ is to be produced whereby the capacitor 93 stores only a corresponding proportion or fraction of the peak voltage. Accordingly, the production or transmittal of a reference pulse is produced in response to the maximum amplitude or height of the source pulse.

Similar considerations apply to the circuit arrangement according to FIG. 3 where the voltage $U_{11}$ tapped off from the potentiometer 84 may be selected so that only the highest peaks of the input voltage produce the desired output reference pulses.

It should be restated here, that the term source generator as used above may either comprise the sensing means 4, 5, the amplifier 6 and the circuit means 7, or it may comprise only the means 4, 5 and 6. The latter will be the case where the claimed circuit will transmit the reference pulses in response to peak values of the source pulses. In this instance, the source pulses are considered to appear at the output of the amplifier 6 and the reference pulses at the output of the circuit means 7. However, where the circuit means supply their output pulses to further circuit means, such as in FIG. 1, the source pulses are then considered to appear at the output of circuit means 7 and the reference pulses at the respective output terminals.

Although the invention has been described with reference to specific example embodiments, it is to be understood, that it is intended to cover all modifications and equivalents within the scope of the appended claims.

What is claimed is:

1. A circuit arrangement for producing electrical reference signals and transmitting such reference signals to an output terminal, comprising a source signal generator, a comparator circuit having a predetermined switching characteristic, an input circuit for connecting said source signal generator to said comparator circuit, said input circuit comprising a capacitor connected between the source signal generator and one input of said comparator circuit, and a diode connected between said one input of the comparator circuit and ground whereby a peak amplitude of a source signal is stored in said capacitor and supplied sequentially with said source signal to said one input of the comparator circuit, said input circuit further comprising adjustable bias means connected to another input of said comparator circuit for applying a reference signal value to said other input, whereby said reference signals are produced at said output terminal in accordance with said predetermined switching characteristic and in response to the maximum amplitude of a source signal produced by said source signal generator.

* * * * *